US008854366B1

(12) United States Patent
Simkins, Jr. et al.

(10) Patent No.: US 8,854,366 B1
(45) Date of Patent: Oct. 7, 2014

(54) AUTOMATED GEOMETRIC REPRESENTATION OF DISCRETE POINT SETS

(75) Inventors: Daniel C. Simkins, Jr., Wesley Chapel, FL (US); Nathaniel Collier, Tampa, FL (US)

(73) Assignee: University of South Florida, Tampa, FL (US)

( * ) Notice: Subject to any disclaimer, the term of this patent is extended or adjusted under 35 U.S.C. 154(b) by 854 days.

(21) Appl. No.: 13/071,156

(22) Filed: Mar. 24, 2011

Related U.S. Application Data

(60) Provisional application No. 61/316,934, filed on Mar. 24, 2010.

(51) Int. Cl.
*G06T 15/00* (2011.01)
*G06T 15/30* (2011.01)
*G06T 15/40* (2011.01)
*G06K 9/00* (2006.01)
*G06K 9/46* (2006.01)
*G06F 17/10* (2006.01)
*G06T 17/20* (2006.01)
*G06F 17/50* (2006.01)

(52) U.S. Cl.
CPC .............. *G06T 17/20* (2013.01); *G06F 17/50* (2013.01)
USPC ........... 345/423; 345/419; 345/420; 382/128; 382/181; 382/203; 703/2

(58) Field of Classification Search
CPC . G06F 17/5018; G06F 2217/16; G06F 17/50; G06F 19/3437; G06F 17/175; G06T 17/20; G06T 17/00; G06T 17/205; G06T 19/00; G06T 17/10; G06T 17/30; G06T 2207/30004; G06T 2210/41; G06T 7/0028; G06T 7/0083
USPC .............. 703/2; 345/419, 420, 423; 382/128, 382/181, 203
See application file for complete search history.

(56) References Cited

U.S. PATENT DOCUMENTS 6,570,568 B1   5/2003   Horn et al.
7,324,103 B2   1/2008   Stewart et al.
(Continued)

OTHER PUBLICATIONS

Simkins Jr., D. C.; Kumar, A.; Collier, N.; Whitenack, L. B. May 24, 2007. Geometry representation, modification and iterative design using RKEM. Comput. Methods Appl. Mech. Engrg. 196:4304-4320.

(Continued)

*Primary Examiner* — Jeffrey Chow
(74) *Attorney, Agent, or Firm* — Andriy Lytvyn; Smith & Hopen, P.A.

(57) ABSTRACT

A system and method of creating a smooth analytical representation of a geometry using a discrete set of points. A meshfree representation of the geometry is generated. The representation includes a set of points. A starting point and an edge length range are then used to generate a set of vertices from the set of points. The vertices are used to generate a coarse mesh, which, in turn, is used to generate a Reproducing Kernel Element Method (RKEM) representation of the geometry. The points of the meshfree representation that were not included in the set of vertices are then applied to the RKEM representation. The quality of the RKEM representation is assessed and compared to a predetermined standard. Additional sets of vertices from the meshfree representation are generated repeatedly and all remaining operations are repeated until the quality of the RKEM at least meets the predetermined standard. This provides a smooth, analytical RKEM representation of the geometry.

24 Claims, 4 Drawing Sheets

(56) References Cited

U.S. PATENT DOCUMENTS

2002/0025074 A1    2/2002    Wilhelm
2004/0197017 A1   10/2004    Olschewski et al.
2012/0095738 A1*   4/2012    Saito et al. .................. 703/2

OTHER PUBLICATIONS

Simkins Jr., D. C.; Collier, N.; Juha, M.; Whitenack, L. B. 2008. A Framework for Studying the RKEM Representation of Discrete Point Sets. Meshfree Methods for Partial Differential Equations IV. Lecture Notes in Computational Science and Engineering. 65:301-314.
Liu, W. K.; Han, W.; Lu, H.; Li, S.; Cao, J. 2004. Reproducing Kernel Element Method: Part I. Theoretical Formulation. Computer Methods in Applied Mechanics and Engineering. 193:933-951.
Li, S.; Lu, H.; Han, W.; Liu, W. K.; Simkins Jr., D. C. 2004. Reproducing Kernel Element Method: Part II. Globally Conforming $I^m/C^n$ Hierarchies. Computer Methods in Applied Mechanics and Engineering. 193:953-987.
Lu, H.; Li, S.; Simkins Jr., D. C.; Liu, W. K.; Cao, J. 2004. Reproducing Kernel Element Method: Part III. Generalized Enrichment and Applications. Computer Methods in Applied Mechanics and Engineering. 193:989-1011.
Simkins Jr., D. C.; Li, S.; Lu, H.; Liu, W. K. 2004. Reproducing Kernel Element Method: Part IV. Globally Compatible $C^n$ ($n \geq 1$) triangular hierarchy. Computer Methods in Applied Mechanics and Engineering. 193:1013-1034.
Collier, N. O. 2009. The quasi-uniformity condition and three-dimensional geometry representation as it applies to the reproducing kernel element method. Theses and Dissertations. Paper 1904. http://scholarcommons.usf.edu/etd/1904.

* cited by examiner

AUTOMATED GEOMETRIC REPRESENTATION OF DISCRETE POINT SETS

CROSS REFERENCE TO RELATED APPLICATIONS

This application claims priority to currently U.S. Provisional Patent Application No. 61/316,934, filed Mar. 24, 2010, which is herein incorporated by reference.

FIELD OF INVENTION

This invention relates to systems and methods of using discrete point sets to create geometric models.

BACKGROUND

A sequence of medical images representing three-dimensional objects, such as a set of magnetic resonance imaging (MRI) or computed tomography (CT) scans are often segmented to form a surface point set representation of an organ, bone, or other object of interest. This point set often contains a very large number of points and significant noise or unwanted data is present. Available software can clean up the data and produce a surface triangularization; however, this often results in a very large number of polygons being created.

In order to perform analysis of the object, such as, for example, Finite Element Analysis (FEA), a full volume mesh must be generated, and, for FEA, the mesh will also have certain restrictions applicable to FEA. The process to convert from raw scans to an analysis-suitable representation can involve dozens of hours of tedious manual manipulations by a user. Further, if one desires to perform "what-if" analyses for different possible scenarios (e.g. possible surgeries) the geometry may be tedious to modify. Final model geometries contain a numerous amount of data, but not much information. Specially trained people must examine the images to extract the information desired (e.g. disease detection).

In certain applications, such as epidemiological studies, a large number of models, perhaps hundreds or thousands, must be processed. The tedious, human-intensive process of manually modifying the surface meshing arising from the discrete point set makes such studies impractical.

SUMMARY

By effectively concentrating the amount of information in each piece of data from a surface point set representation, the amount of data needed to form geometric representation is reduced. This allows for automated, or semi-automated, processing of surface triangulations to produce an analysis-suitable representation for disease, or other condition, assessments. Such a concentration of information may be achieved by creating a smooth analytical geometric representation from a discrete set of points.

The present invention includes a method of creating a smooth analytical representation of a geometry. In an embodiment, the method begins by generating a meshfree representation of the geometry. The meshfree representation includes a set of points. Then, using a starting point and a range of edge length, a set of vertices is generated from the set of points of the meshfree representation. The set of vertices is used to create a coarse mesh and the coarse mesh, in turn, is used to generate a Reproducing Kernel Element Method (RKEM) representation of the geometry. The remaining points of the meshfree representation that were not included in the set of vertices are then applied to the RKEM representation. The quality of the RKEM representation is assessed against a predetermined standard. Additional sets of vertices from the meshfree representation are generated repeatedly and all remaining operations are repeated until the quality of the RKEM at least meets the predetermined standard. This provides a smooth, analytical RKEM representation of the geometry.

The additional set of vertices may be generated by adjusting the range of the edge length. The additional set of vertices may also be generated by adjusting the starting point, or a combination of both.

In an embodiment, the generation of the meshfree representation of the geometry begins by providing a surface triangularization of the geometry. The surface triangularization includes a set of points and triangular faces connecting the set of points. The surface triangulation's set of points is modified to create a modified outer surface point set. An outward directed normal vector is identified at each surface point in the modified outer surface point set and offset points are generated. The offset points are offset towards the interior of the modified outer surface point set along the outward directed normal vector by the amount of a specified wall thickness to create an interior surface point set. If any two points in the interior surface point set are closer than a predetermined distance, the two points are replaced with a third point, which has the average position of the two points. The modified outer surface point set combined with the interior surface point set is the meshfree representation of the geometry.

In order to create a full volume representation, generation of a meshfree representation of the geometry may further include repeating the identification, generation, determination, and replacement operations to successive interior surface point sets until the addition of new points would cause the set of points to be closer than a predetermined distance threshold. The modified outer surface point set combined with the interior surface point set and any successive interior surface point sets is the meshfree representation of the geometry.

Modifying the set of points may include one or more of collapsing small triangles to a single point, removing all un-connected triangles, inserting a new point inside triangles that have low aspect ratios combined with large circum-radii.

Generation of the meshfree representation may further include identifying triangular faces that are difficult to process using a finite element method, discarding the identified triangular faces, and retaining the points that are the vertices of the triangle faces.

Generating a meshfree representation of the geometry may also be carried out using a meshfree method chosen from the following group: the Reproducing Kernel Particle Method, the Element-Free Galerkin Method, the hp-Cloud method, the Smoothed particle hydrodynamics Method, the Diffuse Element Method, the Dissipative Particle Dynamics Method, the Finite Pointset Method, the Natural Element Method, the Material Point Method, the Meshless local Petrov Galerkin Method, the Moving Particle Semi-Implicit Method, the Generalized Finite Difference Method, Particle-in-Cell Method, the Moving Particle Finite Element Method, the Finite Cloud Method, the Boundary Node Method, the Boundary Cloud Method, the Method of Fundamental Solution, the Method of Particular Solution, the Method of Finite Spheres, and the Discrete Vortex Method.

The present invention also includes a computer system having a processor and a tangible memory storage including software instructions that cause the computer system to create a smooth analytical representation of a geometry as described in the method above.

BRIEF DESCRIPTION OF THE DRAWINGS

For a fuller understanding of the invention, reference should be made to the following detailed description, taken in connection with the accompanying drawings, in which.

DETAILED DESCRIPTION

Figure 1:
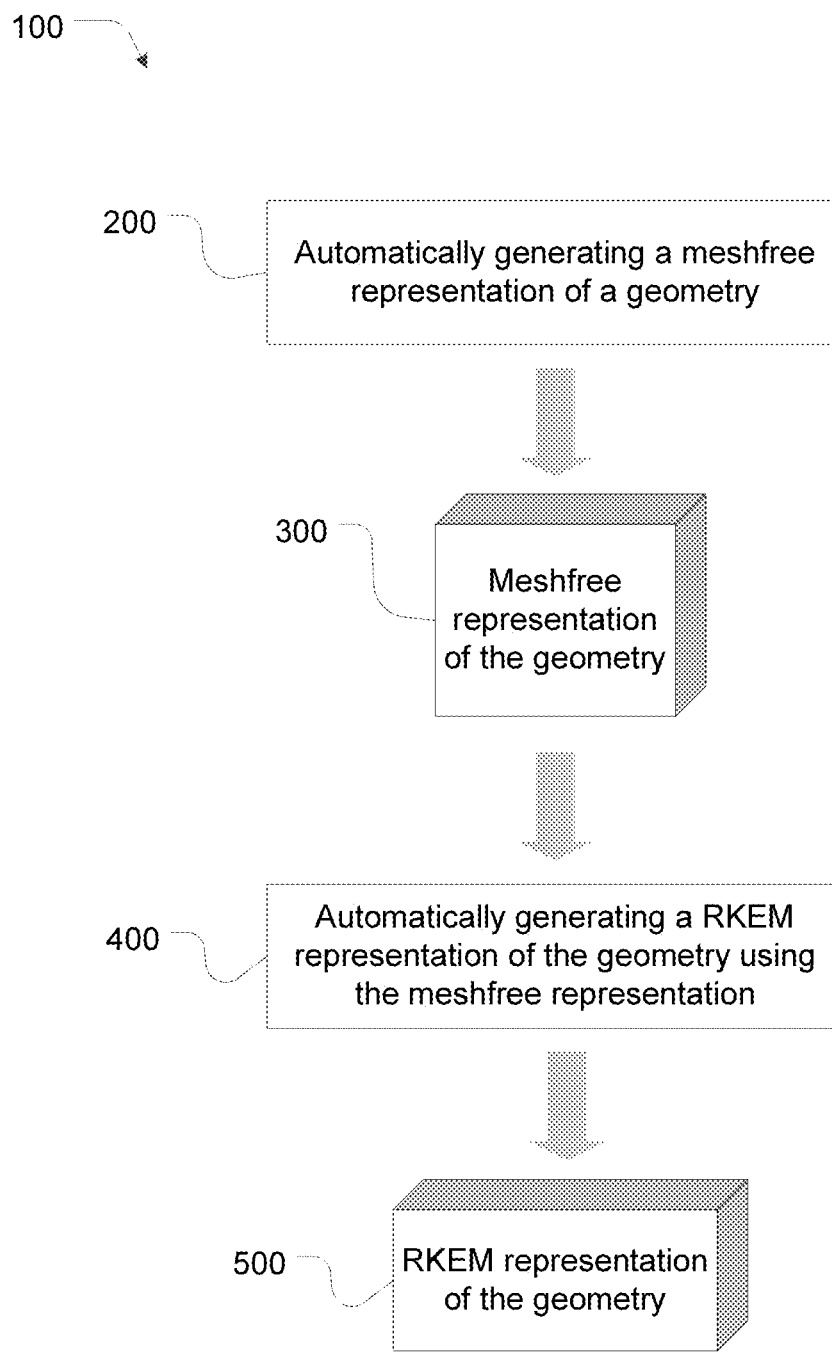
FIG. 1 is a flowchart illustrating the method of creating a smooth analytical representation of a geometry according to an embodiment of the present invention.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The present invention includes a system and method of creating smooth analytical representations of geometries based on discrete point sets. The representations are suitable for direct use in solving analytical equations, modeling geometry, and developing quantitative metrics.

The present invention integrates the use of the Reproducing Kernel Element Method (RKEM). RKEM is a hybrid between finite elements and meshfree methods that provides shape functions of arbitrary order and continuity yet retains the Kronecker-δ property. RKEM is further explained in detail in the following references, which are all incorporated herein by reference: W. K. Liu, W. Han, H. Lu, S. Li, and J. Cao, "Reproducing Kernel Element Method: Part I. Theoretical Formulation," *Computer Methods in Applied Mechanics and Engineering*, 193:933-951 (2004); S. Li, H. Lu, W. Han, W. K. Liu, and D. C. Simkins, Jr., "Reproducing Kernel Element Method, Part II. Global Conforming Im/Cn Hierarchy," *Computer Methods in Applied Mechanics and Engineering*, 193:953-987 (2004); H. Lu, S. Li, D. C. Simkins, Jr., W. K. Liu, and J. Cao, "Reproducing Kernel Element Method Part III. Generalized Enrichment and Applications," *Computer Methods in Applied Mechanics and Engineering*, 193: 989-1011 (2004); and D. C. Simkins, Jr., S. Li, H. Lu, and W. K. Liu, "Reproducing Kernel Element Method Part IV. Globally Compatible C"(n>1) triangular hierarchy," *Computer Methods in Applied Mechanics and Engineering*, 193:1013-1034 (2004).

A mesh approximation may be created and used as the input point set to the RKEM. A discrete point set may also be used as input to the RKEM. An optimal set of Hermite-type nodal weights are computed from the RKEM functions. Such RKEM functions provide a smooth interpolated geometry. The method is also capable of incorporating discontinuities or sharp features as necessary. The RKEM basis functions are higher-order and thus can represent complicated geometry with fewer parameters, making each parameter more significant. This allows for the nodal weights to effectively provide a concentration (or condensed form) of the original data (the complete input point set), thereby reducing the amount of data necessary to create a geometric representation. The nodal weights contain not just information on the location of the geometry points, but also information on the derivatives of the geometry. This increased fidelity (geometry and its derivatives) as well as dense concentration of information (fewer parameters used in interpolation compared to the complete input point set), provides for automated, or semi-automated, processing of surface triangulations to produce an analysis-suitable representation for disease, or other condition, assessments. Such a concentration of information may be achieved by creating a smooth analytical geometric representation from a discrete set of points. In addition, geometry modification can be easily achieved by modifying the nodal weight.

The analytical geometric representations also allow for the ability to compare and correlate two different geometries. For example, a patient's organ analytical geometry may be compared to a known standard organ analytical geometry and the extent of deviation from the standard organ may indicate a medical condition.

A built-in error metric assesses the quality of the representation for use in automated refinement and automatic determination of geometric representations with desired quality. A built-in filtering capability significantly reduces the demands on the user to manually guide the software to produce the geometric representation.

The flowchart of FIG. 1 illustrates the general method of creating a smooth analytical representation of a geometry 100 according to an embodiment of the present invention. As shown, method 100 automatically generates meshfree representation of the geometry 300 in operation 200.

The meshfree method used in operation 200 to generate meshfree representation 300 can be any meshfree Galerkin method known in the art. Examples of meshfree methods include, but are not limited to the Reproducing Kernel Particle Method, the Element-Free Galerkin Method, the hp-Cloud method, the Smoothed particle hydrodynamics Method, the Diffuse Element Method, the Dissipative Particle Dynamics Method, the Finite Pointset Method, the Natural Element Method, the Material Point Method, the Meshless local Petrov Galerkin Method, the Moving Particle Semi-Implicit Method, the Generalized Finite Difference Method, Particle-in-Cell Method, the Moving Particle Finite Element Method, the Finite Cloud Method, the Boundary Node Method, the Boundary Cloud Method, the Method of Fundamental Solution, the Method of Particular Solution, the Method of Finite Spheres, and the Discrete Vortex Method.

Once Meshfree representation 300 is obtained in operation 200, it is used to automatically generate RKEM representation of the geometry 500 in operation 400.

Figure 2:
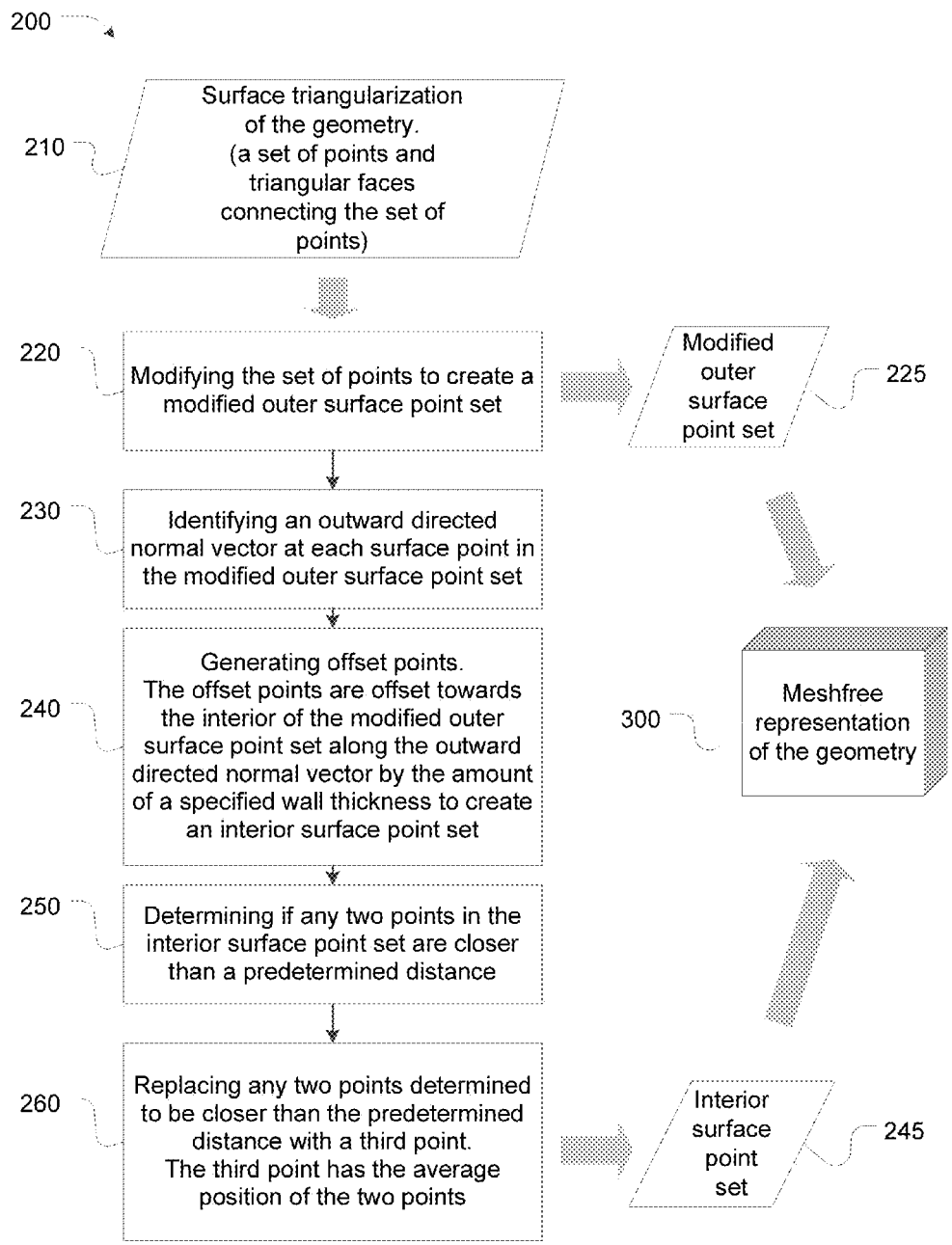
FIG. 2 is a flowchart illustrating the automatic generation of a meshfree representation of a surface or three-dimensional shell geometry according to an embodiment of the present invention.

FIG. 2 is a flowchart illustrating an exemplary embodiment of method 200 (generating meshfree representation 300). In this exemplary embodiment, method 200 begins by providing a surface triangularization of the geometry (operation 210). The surface triangularization includes a set of points and triangular faces connecting the set of points. Taking advantage of the fact that meshfree methods do not need a mesh, this allows the systematic removal, addition, and modification of the point set to improve the distribution of the points. Without the requirement to keep a valid triangulation, this process is simpler than generating a suitable mesh. The surface triangulation's set of points is modified to create modified outer surface point set 225 (operation 220). Example modifications of the surface triangulation's set of points include collapsing small triangles to a single point, removing all un-connected triangles, inserting a new point inside triangles that have low aspect ratios combined with large circum-radii. These examples are not meant to be limiting and other modifications of the surface triangulation's set of points that improve the uniformity of the point distribution may be used. Triangles that pose difficulty for finite element methods, such as sliver triangles, can simply be discarded while only retaining their vertices.

Once a suitable surface point set is determined, a full volume point set can be generated. For each type of anatomical organ or feature, the user can specific a wall thickness or a full volume. Wall thickness is used for organs such as the bladder, where the organ itself does not occupy the entire enclosed volume of its surface. In this case, an outward directed normal vector is identified at each surface point in modified outer surface point set 225 and offset points are generated (operation 230). The offset points are offset towards the interior of modified outer surface point set 225 along the outward directed normal vector by the amount of a specified wall thickness to create interior surface point set 245 (operation 240). Interior surface point set 225 is a self-similar interior surface point set. Interior surface point set 225 is then checked to see if the offset process placed two point too close together. If any two points in interior surface point set 245 are closer than a predetermined distance, the two points are replaced with a third point, which has the average position of the two points (operation 250 and 260). This ensures that the proper point distribution is maintained. Modified outer surface point set 225 combined with interior surface point set 245 provides meshfree representation 300.

Figure 3:
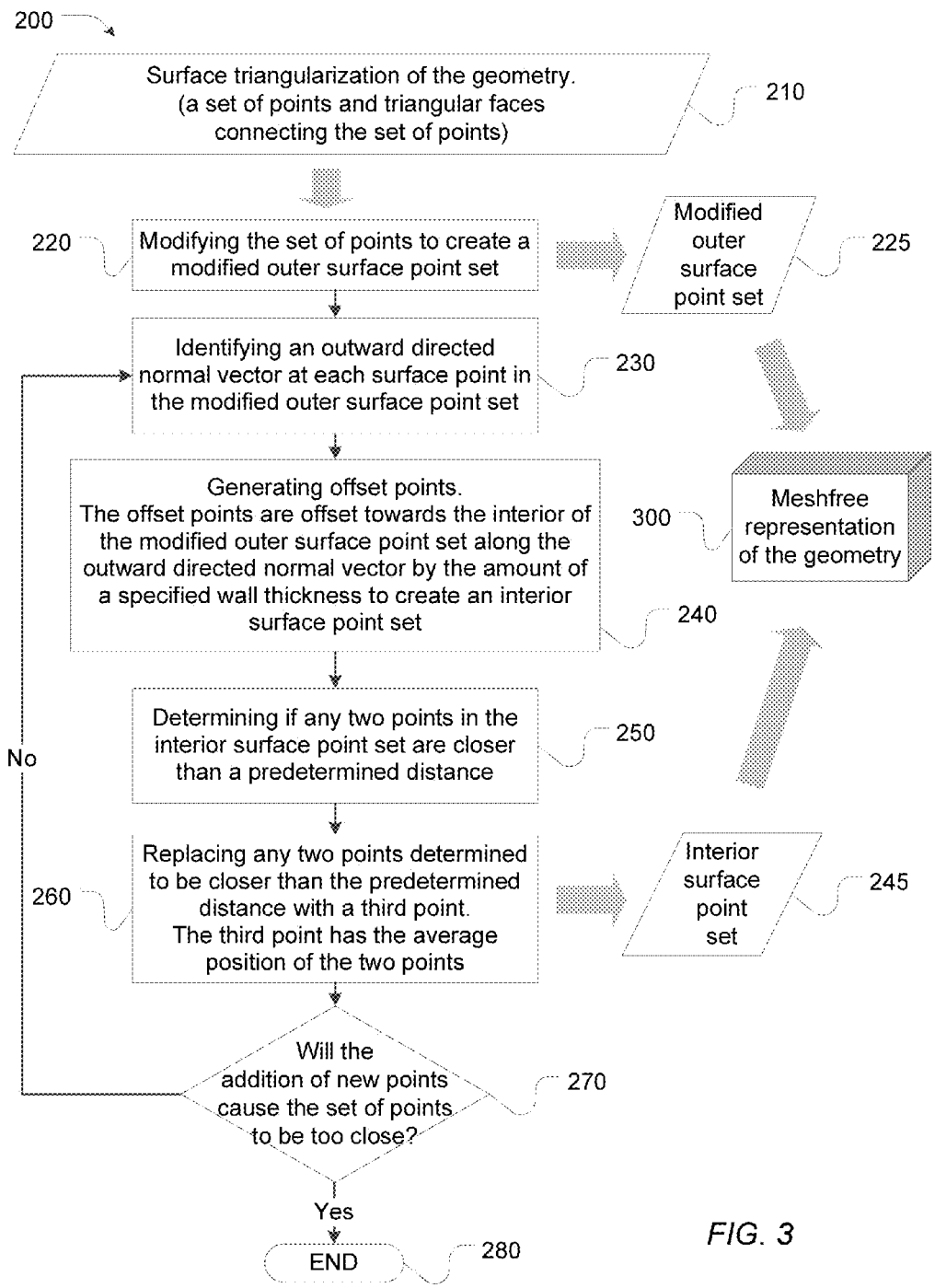
FIG. 3 is a flowchart illustrating the automatic generation of a full volume, meshfree representation of a geometry according to an embodiment of the present invention.

FIG. 3 is a flowchart illustrating an exemplary embodiment of method 200 in which the meshfree representation generated is a full volume meshfree representation. This method follows the embodiment shown in FIG. 2 and described above except that the identification (operation 230), generation (operation 240), determination (operation 250), and replacement (operation 260) operations are repeated on successive interior surface point sets. This repetition is analogous to an onion's layering—the geometry is built layer by layer toward the center, stopping when the addition of any new points leads to points being too close together. The repetition continues until the addition of new points would cause the set of points to be closer than a predetermined distance threshold (see operation 270). Modified outer surface point set 225 combined with interior surface point set 245 and any successive interior surface point sets provides full volume meshfree representation 300. It is possible to have the generated interior surface points 'pass through' the opposing surface as the representation is created. This can be detected using a standard contact detection algorithm for meshfree methods.

Figure 4:
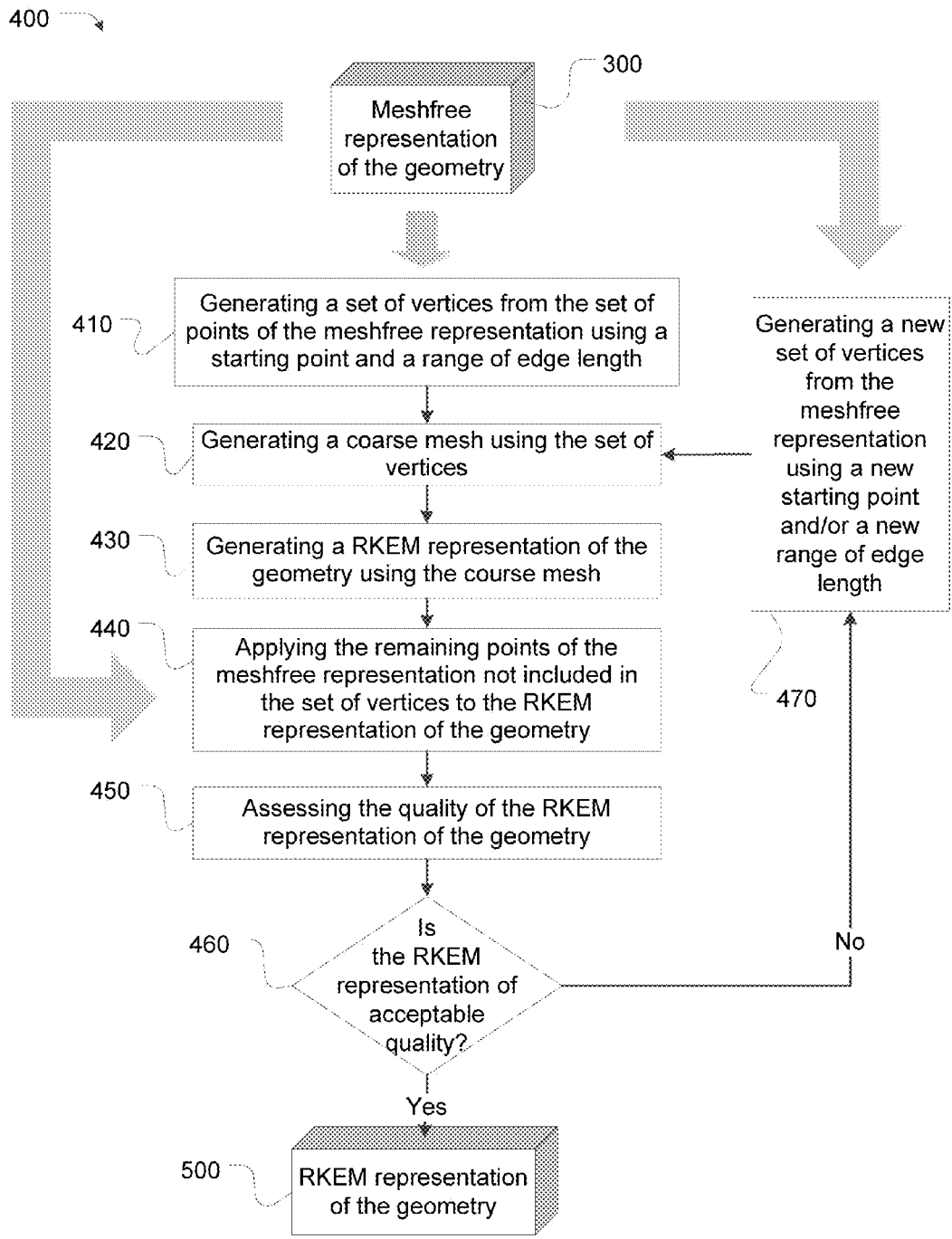
FIG. 4 is a flowchart illustrating the automatic generation of a RKEM representation of a geometry using a meshfree representation according to an embodiment of the present invention.

Geometric modification, concentration of geometric information, and computer-aided design (CAD)-like modification capabilities available in the present invention are based on the creation of a geometric representation using RKEM. As illustrated in the flowchart of FIG. 4, once meshfree representation 300, is generated, a starting point and a range of edge length are used to generate a set of vertices from the set of points of meshfree representation 300 (operation 410). The set of vertices is used to create a coarse mesh (operation 420). The coarse mesh can be generated by any known meshing software. The coarse mesh, in turn, is used to generate a Reproducing Kernel Element Method (RKEM) representation of the geometry (operation 430). In other words, the coarse mesh is used as the RKEM base mesh and an RKEM function space is defined on it. The remaining points of the meshfree representation that were not included in the set of vertices are then applied to the RKEM representation (operation 440). Such application may be done according to the algorithm described in D. C. Simkins, Jr., A. Kumar, N. Collier, and L. Whitenack, "Geometry Representation, Modification, and Iterative Design using RKEM", *Computer Method in Applied Mechanics and Engineering*, 196: 4304-4320 (2007), which is herein incorporation by reference.

For volume representations, the determinant of the isogeometric transformation Jacobian can be used as an error metric. It was shown in D. C. Simkins, Jr., N. Collier, M. Juha, and L. Whitenack, "A Framework for Studying the RKEM Representation of Discrete Point Sets", *Meshfree Methods for Partial Differential Equations IV* (Lecture Notes in Computational Science and Engineering Vol. 65) 301-314 (2008), which is herein incorporation by reference, that this was a suitable metric and leads to convergence in the geometry representations under refinement.

The quality of the RKEM representation is assessed against a predetermined standard (operation 450). Additional sets of vertices from the meshfree representation are generated repeatedly and all remaining operations are repeated until the quality of RKEM representation 500 at least meets the predetermined standard (see operation 470). This provides a smooth, analytical RKEM representation of the geometry. The additional set of vertices may be generated by adjusting the range of the edge length. The additional set of vertices may also be generated by adjusting the starting point, or a combination of both.

Method 200 for automatically generating a meshfree representation and method 400 for generating an RKEM representation can also operate completely independent of one another. The meshfree representation created in method 200 is useful on its own accord and has numerous applications as would be apparent to one of ordinary skill in the art. In addition, although described above to take a meshfree representation as input, method 400 can also take a discrete point set as input. The set of vertices (in operations 410 and 470) are then generated from the discrete point set instead of the meshfree representation and the remaining points of the discrete point set (in operation 440) are applied to the RKEM representation instead of the remaining points of the meshfree representation.

The present invention also includes a computer system having a processor and a tangible memory storage including software instructions that cause the computer system to create a smooth analytical representation of a geometry as described in the method above.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between.

What is claimed is:

1. A method of creating a smooth analytical representation of a geometry, comprising:
    generating a meshfree representation of the geometry, the meshfree representation having a set of points;

generating a set of vertices from the set of points of the meshfree representation using a starting point and a range of edge length;
generating a coarse mesh using the set of vertices;
generating a Reproducing Kernel Element Method (RKEM) representation of the geometry using the course mesh;
applying the remaining points of the meshfree representation not included in the set of vertices to the RKEM representation of the geometry;
assessing the quality of the RKEM representation of the geometry against a predetermined standard; and
repeatedly generating an additional set of vertices from the meshfree representation and repeating all remaining operations until the quality of the RKEM representation of the geometry at least meets the predetermined standard;
wherein generating a meshfree representation of the geometry comprises:
providing a surface triangularization of the geometry, the surface triangularization having a set of points and triangular faces connecting the set of points;
modifying the surface triangularization's set of points to create a modified outer surface point set;
identifying an outward directed normal vector at each surface point in the modified outer surface point set;
generating a plurality of offset points, wherein the plurality of offset points are offset towards the interior of the modified outer surface point set along the outward directed normal vector by the amount of a specified wall thickness to create an interior surface point set;
determining if any two points in the interior surface point set are closer than a predetermined distance; and
replacing any two points determined to be closer than the predetermined distance with a third point, the third point having the average position of the two points;
whereby the modified outer surface point set combined with the interior surface point set is the meshfree representation of the geometry.

2. The method of claim 1, wherein generating a meshfree representation of the geometry further comprises:
repeating the identification, generation, determination, and replacement operations to successive interior surface point sets until the addition of new points would cause the set of points to be closer than a predetermined distance threshold;
whereby the modified outer surface point set combined with the interior surface point set and any successive interior surface point sets is the meshfree representation of the geometry.

3. The method of claim 1, wherein modifying the set of points includes collapsing small triangles to a single point.

4. The method of claim 1, wherein modifying the set of points includes removing all un-connected triangles.

5. The method of claim 1, wherein modifying the set of points includes inserting a new point inside triangles that have low aspect ratios combined with large circum-radii.

6. The method of claim 1, further comprising:
identifying triangular faces that are difficult to process using a finite element method;
discarding the identified triangular faces; and retaining the points that are the vertices of the triangle faces.

7. A computer system adapted to create a smooth analytical representation of a geometry, the computer system comprising:
a processor; and a tangible memory storage including software instructions that cause the computer system to perform:
generating a meshfree representation of the geometry, the meshfree representation having a set of points,
generating a set of vertices from the set of points of the meshfree representation using a starting point and a range of edge length,
generating a coarse mesh using the set of vertices,
generating a Reproducing Kernel Element Method (RKEM) representation of the geometry using the course mesh,
applying the remaining points of the meshfree representation not included in the set of vertices to the RKEM representation of the geometry,
assessing the quality of the RKEM representation of the geometry against a predetermined standard, and
repeatedly generating an additional set of vertices from the meshfree representation and repeating all remaining operations until the quality of the RKEM representation of the geometry at least meets the predetermined standard;
wherein generating a meshfree representation of the geometry comprises:
providing a surface triangularization of the geometry, the surface triangularization having a set of points and triangular faces connecting the set of points;
modifying the surface triangularization's set of points to create a modified outer surface point set;
identifying an outward directed normal vector at each surface point in the modified outer surface point set;
generating a plurality of offset points, wherein the plurality of offset points are offset towards the interior of the modified outer surface point set along the outward directed normal vector by the amount of a specified wall thickness to create an interior surface point set;
determining if any two points in the interior surface point set are closer than a predetermined distance; and
replacing any two points determined to be closer than the predetermined distance with a third point, the third point having the average position of the two points;
whereby the modified outer surface point set combined with the interior surface point set is the meshfree representation of the geometry;
whereby the computer system creates the smooth analytical representation of the geometry.

8. The computer system of claim 7, wherein generating a meshfree representation of the geometry further comprises:
repeating the identification, generation, determination, and replacement operations to successive interior surface point sets until the addition of new points would cause the set of points to be closer than a predetermined distance threshold;
whereby the modified outer surface point set combined with the interior surface point set and any successive interior surface point sets is the meshfree representation of the geometry.

9. The computer system of claim 7, wherein modifying the set of points includes collapsing small triangles to a single point.

10. The computer system of claim 7, wherein modifying the set of points includes removing all un-connected triangles.

11. The computer system of claim 7, wherein modifying the set of points includes inserting a new point inside triangles that have low aspect ratios combined with large circum-radii.

12. The computer system of claim 7, wherein the tangible memory storage further includes software instructions that cause the computer system to perform:
   identifying triangular faces that are difficult to process using a finite element method,
   discarding the identified triangular faces; and retaining the points that are the vertices of the triangle faces.

13. A method of generating a meshfree representation of a geometry, comprising:
   providing a surface triangularization of the geometry, the surface triangularization having a set of points and triangular faces connecting the set of points;
   modifying the surface triangularization's set of points to create a modified outer surface point set;
   identifying an outward directed normal vector at each surface point in the modified outer surface point set;
   generating a plurality of offset points, wherein the plurality of offset points are offset towards the interior of the modified outer surface point set along the outward directed normal vector by the amount of a specified wall thickness to create an interior surface point set;
   determining if any two points in the interior surface point set are closer than a predetermined distance; and
   replacing any two points determined to be closer than the predetermined distance with a third point, the third point having the average position of the two points;
   whereby the modified outer surface point set combined with the interior surface point set is the meshfree representation of the geometry.

14. The method of claim 13, further comprises:
   repeating the identification, generation, determination, and replacement operations to successive interior surface point sets until the addition of new points would cause the set of points to be closer than a predetermined distance threshold;
   whereby the modified outer surface point set combined with the interior surface point set and any successive interior surface point sets is the meshfree representation of the geometry.

15. The method of claim 13, wherein modifying the set of points includes collapsing small triangles to a single point.

16. The method of claim 13, wherein modifying the set of points includes removing all un-connected triangles.

17. The method of claim 13, wherein modifying the set of points includes inserting a new point inside triangles that have low aspect ratios combined with large circum-radii.

18. The method of claim 13, further comprising:
   identifying triangular faces that are difficult to process using a finite element method;
   discarding the identified triangular faces; and retaining the points that are the vertices of the triangle faces.

19. A computer system adapted to generate a meshfree representation of the geometry, the computer system comprising:
   a processor; and
   a tangible memory storage including software instructions that cause the computer system to perform:
      providing a surface triangularization of the geometry, the surface triangularization having a set of points and triangular faces connecting the set of points,
      modifying the surface triangularization's set of points to create a modified outer surface point set,
      identifying an outward directed normal vector at each surface point in the modified outer surface point set,
      generating a plurality of offset points, wherein the plurality of offset points are offset towards the interior of the modified outer surface point set along the outward directed normal vector by the amount of a specified wall thickness to create an interior surface point set,
      determining if any two points in the interior surface point set are closer than a predetermined distance, and
      replacing any two points determined to be closer than the predetermined distance with a third point, the third point having the average position of the two points,
   whereby the computer system generates the meshfree representation of the geometry comprising the modified outer surface point set combined with the interior surface point set.

20. The computer system of claim 19, wherein the tangible memory storage further includes software instructions that cause the system to perform:
   repeating the identification, generation, determination, and replacement operations to successive interior surface point sets until the addition of new points would cause the set of points to be closer than a predetermined distance threshold;
   whereby the modified outer surface point set combined with the interior surface point set and any successive interior surface point sets is the meshfree representation of the geometry.

21. The computer system of claim 19, wherein modifying the set of points includes collapsing small triangles to a single point.

22. The computer system of claim 19, wherein modifying the set of points includes removing all un-connected triangles.

23. The computer system of claim 19, wherein modifying the set of points includes inserting a new point inside triangles that have low aspect ratios combined with large circum-radii.

24. The computer system of claim 19, wherein the tangible memory storage further includes software instructions that cause the computer system to perform:
   identifying triangular faces that are difficult to process using a finite element method,
   discarding the identified triangular faces; and retaining the points that are the vertices of the triangle faces.

* * * * *